United States Patent
Karazim et al.

(10) Patent No.: US 6,192,829 B1
(45) Date of Patent: Feb. 27, 2001

(54) ANTENNA COIL ASSEMBLIES FOR SUBSTRATE PROCESSING CHAMBERS

(75) Inventors: Michael P. Karazim, San Jose; Tetsuya Ishikawa, Santa Clara; Rudolf Gujer, Saratoga; Thomas Kring, Fremont; Pavel Staryuk, San Jose; Abhi Desai, Fremont; Tom Cho, San Jose; Michael Douglas, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/398,746

(22) Filed: Sep. 17, 1999

Related U.S. Application Data
(60) Provisional application No. 60/132,571, filed on May 5, 1999.

(51) Int. Cl.⁷ .............................. C23C 16/00; H05H 1/00
(52) U.S. Cl. .................. 118/723 AN; 118/723 I; 118/724; 156/345; 315/111.51
(58) Field of Search ............. 118/723 AN, 723 I, 118/724, 723 IR; 204/298.34, 298.06; 156/345; 219/56, 542, 520, 522, 525; 315/111.51, 111.71

(56) References Cited

U.S. PATENT DOCUMENTS

| | | | |
|---|---|---|---|
| 5,282,221 | * | 1/1994 | Benedict et al. ............. 219/542 |
| 5,540,824 | | 7/1996 | Yin et al. ............. 204/298.34 |
| 5,800,621 | | 9/1998 | Redeker et al. ............. 118/723 AN |

* cited by examiner

*Primary Examiner*—Gregory Mills
*Assistant Examiner*—P. Hassanzadeh
(74) *Attorney, Agent, or Firm*—Townsend & Townsend & Crew

(57) ABSTRACT

The present invention provides exemplary antenna coil assemblies and substrate processing chambers using such assemblies. In one embodiment, an antenna coil assembly (100) for a substrate processing chamber includes an antenna coil (102) disposed in a frame (104). The frame includes a plurality of spaced apart tabs (120) around a periphery of the frame, with the coil coupled to the frame at the tabbed locations. At least one notch (122) is provided between each pair of adjacent tabs. The notches are adapted to facilitate thermal expansion and contraction of the frame at the notched locations to reduce stresses on the frame and coil connections.

22 Claims, 4 Drawing Sheets

ANTENNA COIL ASSEMBLIES FOR SUBSTRATE PROCESSING CHAMBERS

The subject application claims priority from U.S. Provisional Patent Application No. 60/132,571, filed May 5, 1999, the complete disclosure of which is incorporated herein by reference.

BACKGROUND OF THE INVENTION

The present invention relates generally to substrate processing chambers, and more specifically, to antenna coil assemblies for use with substrate processing chambers.

It has been found advantageous in the art of substrate processing used in making integrated circuits to utilize high density plasmas to enhance chemical deposition, etching, or cleaning reactions in a substrate or substrate processing chamber. It is known that inductively coupled plasma sources may provide high density plasma (e.g., $1 \times 10^{11}$ to $2 \times 10^{12}$ ions/cm$^3$) and low energy bombardment of the processing surface (i.e., electron temperature $T_e$ of about a few electron volts or eV).

In some high density plasma substrate processing systems, a helical antenna coil is wound around the exterior surface of a dielectric (quartz) dome or cylinder forming a portion of the vacuum processing chamber. An RF current (i.e., from about 100 KHz to about 100 MHz) is passed through the antenna coil. When operated in a resonance mode with the applied RF power, an RF current (IRF) circulating in the antenna coil generates an axial RF magnetic field ($B_{RF}$) within the processing chamber volume antenna coil. This magnetic field ($B_{RF}$) induces a circulating RF electron current in the gas in the enclosed chamber to maintain a high energy plasma in the gas once the plasma is lit (i.e., once the gas becomes partially ionized by electron collisions). The configuration formed may be considered an RF transformer with the antenna coil acting as the primary winding and the plasma itself acting as the secondary winding.

In one commercially successful HDP chamber, the chamber utilizes a top coil and a side coil to enable tuning of the power delivered to the chamber and enhance uniformity of the plasma. The side coil is maintained within a sleeve to correctly position the coil relative to the processing chamber. The sleeve further includes a heating element to attempt to maintain constant heat throughout the sleeve.

Notwithstanding the success of the HDP system, improvements are desired. The thermal expansion and contraction of the sleeve caused by heat generated by the heating element and cooling performed by the antenna coil produce thermal stresses on the sleeve. Problems have arisen when the sleeve cracks under the stresses caused by this thermal cycling. Cracks in the sleeve can propagate to the coil, causing leakage of the cooling fluid and shutdown of the processing chamber.

It is desirable, therefore, to provide improved antenna coil assemblies, which alleviate at least some of the problems caused by thermal cycling stresses.

SUMMARY OF THE INVENTION

The present invention provides exemplary antenna coil assemblies and substrate processing chambers using such assemblies. In one embodiment of the present invention, an antenna coil assembly for a substrate processing chamber includes an antenna coil disposed in a frame. The frame includes a plurality of spaced apart tabs around a periphery of the frame, with the coil coupled to the frame at the tabbed locations. At least one notch is provided between each pair of adjacent tabs. The notches are adapted to facilitate thermal expansion and contraction of the frame between the tabs. In this manner, stresses caused by thermal cycling which would otherwise be transferred to the tabs, and hence to the antenna coil, are reduced by concentrating the stresses at the notches between the tabs.

In one aspect of the invention, the antenna coil includes at least two turns of a tubing comprising a thermally conductive material. In another aspect, the frame includes two turns of a generally trough-shaped frame defining upper and lower frame portions. The antenna coil first turn preferably is disposed in the upper frame portion and the antenna coil second turn is disposed in the lower frame portion. In one aspect, the frame has a generally cylindrical shape, however, it will be appreciated by those skilled in the art that the antenna coil assembly can have a variety of shapes for use with a variety of shaped processing chambers.

Preferably, the frame comprises a thermally conductive material such as copper. The antenna coil assembly further preferably includes at least one heating element disposed in the frame. In one aspect, the heating element has a first turn disposed in the upper frame portion and a second turn disposed in the lower frame portion. In another aspect, the antenna coil assembly includes first and second heating elements, with each heating element having a first turn disposed in the upper frame portion and a second turn disposed in the lower frame portion.

In another aspect, the antenna coil assembly includes a plurality of notches between each pair of adjacent tabs. In this manner, the notches provide a position of the frame which can facilitate the thermal expansion and contraction thereof. Preferably, the plurality of notches locally reduce the thickness of the frame to facilitate the flexing of the frame between adjacent tabs. In still another aspect, the notches are positioned around the periphery of the frame in a manner to reduce the stresses on the frame at the tabs due to thermal cycling.

In one aspect of the present invention, the antenna coil assembly further includes a plurality of clamps coupled to at least a portion of the plurality of tabs. In one particular aspect, each of the plurality of clamps includes a spacer, with the spacers positioned between the upper and lower frames to maintain a generally uniform distance therebetween.

In another embodiment of the present invention, an antenna coil assembly includes an antenna coil and at least one heating element disposed in a frame. The frame has first and second turns defining upper and lower frame portions, and a plurality of spaced apart tabs around the periphery of the upper and lower frame portions. At least one notch is positioned between each pair of adjacent tabs so that the notches facilitate thermal expansion and contraction of the upper and lower frame portions between the tabs.

In one aspect, the antenna coil and heating element each have a first turn disposed in the upper frame portion and a second turn disposed in the lower frame portion. Preferably, the notches are positioned around the periphery of the frame in a manner in which to reduce stresses on the frame at the tabs due to the thermal expansion and contraction of the frame.

The invention further provides an exemplary chamber for processing a substrate. The chamber includes a chamber body having a top and side walls defining an interior. The chamber includes an antenna coil assembly, as previously described, disposed adjacent to the sidewalls. In one aspect, the chamber further includes a plurality of clamps coupled to at least a portion of the plurality of tabs. The clamps operate to locally maintain the antenna coil assembly adjacent to the sidewalls. In another aspect of the invention, the clamps comprise an electrically nonconductive material. Each clamp includes a spacer, with the spacers adapted to maintain a gap between the upper and lower frame portions.

Other features and advantages of the invention will appear from the following description in which the preferred embodiment has been set forth in detail in conjunction with the accompanying drawings.

DETAILED DESCRIPTION OF THE SPECIFIC EMBODIMENTS

Figure 1:
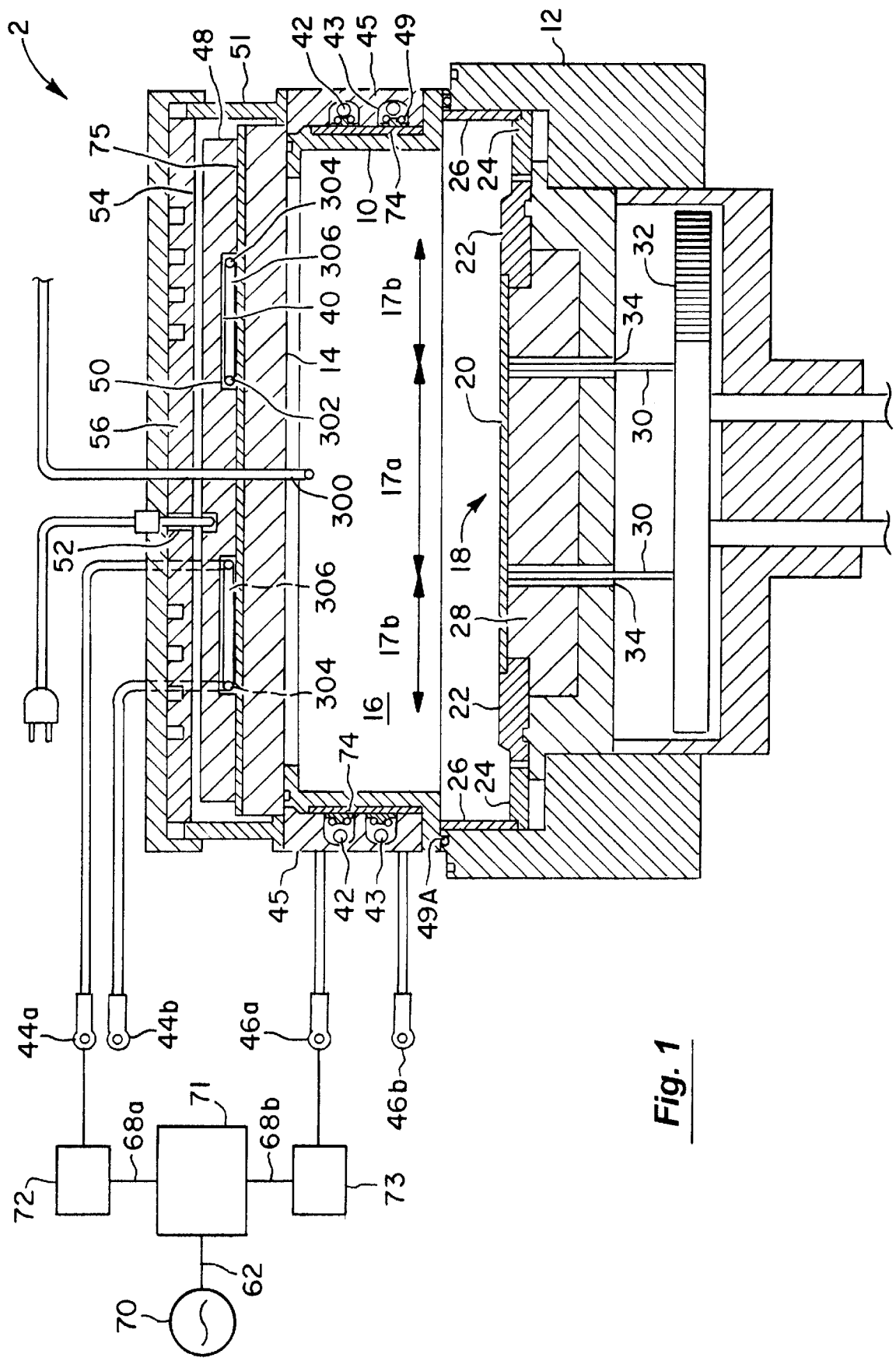
FIG. 1 is a schematic cross-sectional view depicting a plasma enhanced CVD processing system employing an antenna coil assembly of the present invention.

FIG. 1 is a schematic cross-sectional view of a CVD substrate processing system 2 for use with the present invention. It will be appreciated by those skilled in the art that the present invention may be used with other CVD, etching, and similar substrate processing apparatus that employ a coil.

A generally cylindrical dome 10 made of a dielectric material, such as quartz, ceramic, $Al_2O_3$ or the like, is mounted on a vacuum chamber body 12. At one end of the cylindrical dome 10, there is a flange which abuts against and, with the aid of an O ring 49A, forms a vacuum seal with the chamber body 12. A circular dielectric plate 14 seals the other end of the dome 10 thereby forming a sealed processing cavity 16 in which plasma processing takes place. The cylindrical dome 10 and the dielectric plate 14 combination is also generally referred to as a dome. Both are transparent to RF power which is coupled into the chamber by appropriately positioned antennas which are described below.

Inside the plasma processing cavity 16 there is an electrostatic chuck assembly 18 which holds a substrate during processing. The outer perimeter of the e-chuck 18 is protected from the corrosive effects of the plasma and from current leakage between the e-chuck 18 and the plasma by a dielectric collar or ring 22 that surrounds the e-chuck 18. Beyond the dielectric collar or ring 22 is an annular plate 24 and a cylindrically-shaped liner 26 which protect the rest of the interior surfaces of the chamber body 12 from the plasma during operation. The annular plate 24 and the liner 26 are made of either a dielectric material (e.g., quartz, $Al_2O_3$, or other ceramic) or a conductive material (e.g., silicon carbide, graphite, carbon fiber material, aluminum, etc.) depending upon the particular processing application and other design considerations. In the described embodiment, where dielectric plate 14 is made of $Al_2O_3$ or AlN, both plate 24 and liner 26 are made of a conductive material to provide sufficient conductive area for a return path for the RF bias current that is applied to the e-chuck 18.

E-chuck 18 includes a metal pedestal 28 with a dielectric/insulating layer 20 formed on its top surface. By applying an RF bias voltage to the e-chuck 18 relative to the plasma that forms above it, the resulting electrostatic field that is formed across the dielectric layer 20 holds the substrate firmly against the top of the e-chuck 18. In the described embodiment, a cooling gas (e.g., helium) is supplied through conduits (not shown) within the body of the e-chuck 18 to the backside of the substrate to facilitate heat transfer between the substrate and the pedestal 28.

Pins 30 that are connected to a movable platform 32 in the bottom of the chamber extend upwardly through holes 34 that pass through e-chuck 18 and are used to lower the substrate onto the e-chuck 18 prior to plasma processing and to lift the substrate off of the e-chuck 18 thereafter. A pneumatic or motor assembly (not shown) located beneath the chamber raises and lowers the movable platform 32.

RF power is supplied to the plasma cavity 16 through one or more antennae, namely, a top antenna coil 40 and a side antenna coil 42. Both antenna coils 40, 42 are preferably made of copper wire, but may be made of any highly conductive material. Top antenna coil 40 is a flat coil that is located adjacent to the top side of the dielectric plate 14 and configured to allow a gas inlet 300 to be disposed through the dielectric plate 14.

In one embodiment, the top antenna coil 40 configuration has two annular coil turns, namely a central coil turn 302 and a concentric outer coil turn 304. The annular coil turns 302 and 304 are connected by a plurality of radially extending conductors 306 which inductively couple power into the processing region 16 to generate a plasma above the substrate.

Side antenna coil 42 is a cylindrically shaped coil that is wound around the outside wall of the cylindrical dome 10. RF power is supplied to the top antenna coil 40 through an antenna connection 44A and to the side antenna coil 42 through an antenna connection 46A. The antenna coils 40, 42 are grounded through other antenna connections 44B, 46B, respectively. RF power may be supplied by two separate RF power supplies. Alternatively, the RF power may be supplied from a single RF power source 70 as shown, via a splitter 71 and two matching networks 72, 73. The RF generator 70, which preferably has a 50 ohm output impedance, is connected through a 50 ohm coaxial cable 62 to a power splitter 71 and then to two RF matching networks 72, 73 via two output lines 68a, 68b, one connected to matching network 72 and the other connected to matching network 73.

In general, the RF matching networks 72, 73 include one or more variable reactive elements (e.g., inductors or capacitors) by which the impedance of each RF matching network can be adjusted to achieve a match condition between the power splitter 71 and the antenna coils 40, 42 to thereby maximize the RF power that is delivered to the plasma within the chamber. An RF detector circuit within RF matching networks 72, 73 monitors the power transferred into the chamber and generates therefrom control signals which achieve and maintain a match condition.

An insulated cover plate 48 covers the top antenna coil 40 in grooves 50 formed in its bottom surface which have the same shape as the top antenna 40 and which completely contain the top antenna 40 when the cover plate 48 is placed onto the dielectric plate 14. A faraday shield 75 (comprising a conductive, non-magnetic metal) is disposed between the top coil 40 and the dielectric plate 14. Cover plate 48 mechanically holds the top antenna coil 40 in a fixed position relative to the chamber and electrically isolates the turns of the coil so that arcing between turns does not occur.

Cover plate 48 may include a heating element 52 to heat the lid. Immediately above and adjacent to cover plate 48 there is an air gap 54 and a cooling assembly 56 which acts as a heat sink for the heat that is dissipated by the heated cover plate 48. Heating element 52 and heat transfer assembly 56 are used to heat or cool and maintain the temperature of the cover plate 48 and the dielectric plate 14 at a predetermined level during operation. System 2 further may include a series of spaced apart temperature sensors (not shown) to monitor temperature of the ceramic dome 10 during operation. It is desirable to have a minimal delta T throughout the dome 10 during operation.

A cylindrical frame 45 surrounds the cylindrical dome 10 and includes grooves 43 for holding the turns of the side antenna coil 42. Frame 45 provides mechanical stability and positioning of the turns relative to the chamber and provides insulation between turns of the coil which prevent arcing. A faraday shield 74 comprising a conducting, non-magnetic metal is disposed between the side coil 42 and the cylindrical dome 10 and is slotted to prevent current circulation similar to top coil faraday shield 75.

Frame 45 includes a heater element 49 which provides indirect heating to the wall of cylindrical dome 10 to stabilize the plasma process. A heat conducting collar 51, which is located above and contacts the top of the frame 45, provides a heat sink for the heated frame 45 by creating a heat flow path up to the cooling assembly 56 at the top of the chamber. For example, in some processes it is desirable to heat the chamber wall (e.g., to about 200° C.) so that precursor gases introduced into the chamber deposit on a substrate rather than on a wall of the dome 10.

The top antenna coil 40 delivers RF power in a proportionally larger amount to the center region 17A of cavity 16 as compared to an outer perimeter region 17B that surrounds the center region 17A. If used by itself, top antenna coil 40 is configured and positioned to produce a center-peaked plasma density profile above the surface of the substrate 20. In contrast, a side antenna coil 42 delivers RF power in proportionally greater amounts to the outer perimeter regions 17B of cavity 16. If used by itself, side antenna coil 42 is configured and positioned to produce a center-hollow plasma density profile above the surface of substrate 20. When the two antennas 40, 42 are operated together, and RF power is appropriately divided among them, their superposition or vector sum produces a uniform plasma density profile across the top of the substrate 20. Further details on the operation of system 2 depicted in FIG. 1 are described in U.S. patent Ser. No. 5,800,621 assigned to the assignee of the present invention, the complete disclosure of which is incorporated herein by reference.

Figure 2A:
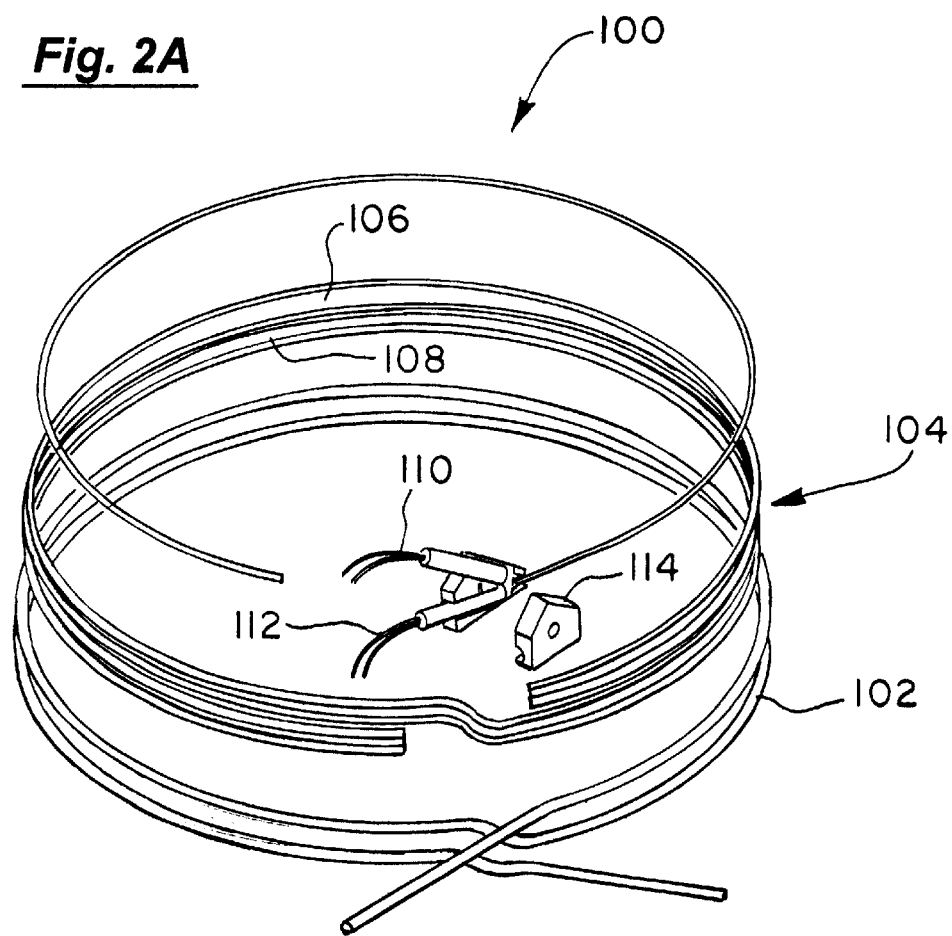
FIGS. 2A and 2B depict exploded and assembled overall views, respectively, of an antenna coil assembly according to the present invention.
Figure 2B:
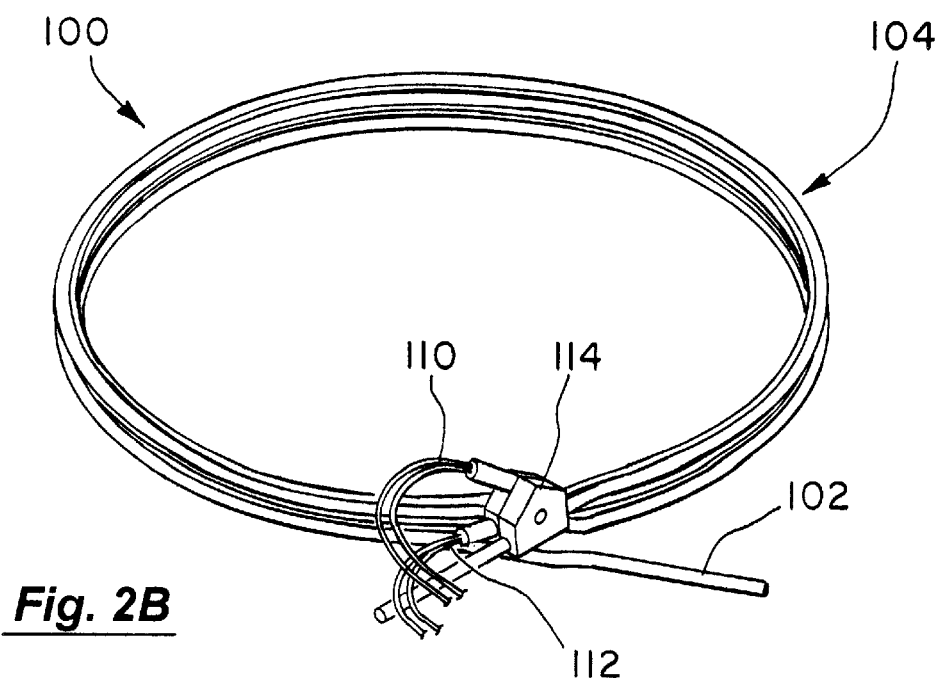

Turning now to FIGS. 2A–2B, an exemplary antenna coil assembly 100 in accordance with the present invention will now be described. FIGS. 2A and 2B depict exploded and assembled views, respectively, of assembly 100. Antenna coil assembly 100 includes an antenna coil 102. Coil 102 is a tubing which preferably comprises copper or other electrically conductive materials. In one specific embodiment, coil 102 comprises a copper tubing having a wall thickness that is about 0.065 inches. Water is flowed through coil 102 during operation of system 2. Antenna coil assembly 100 includes a frame 104, depicted as frame 45 in FIG. 1. Coil 102 is coupled to frame 104 at a plurality of spaced apart locations as described below in further detail. Frame 104 comprises an upper frame portion 106 and a lower frame portion 108. As depicted in FIGS. 2A–2B, frame 104 is a single frame piece having two turns, with the first turn defining upper frame portion 106 and the second turn defining lower frame portion 108. Alternatively, frame 104 may comprise separate components to define upper and lower frame portions 106 and 108. Frame 104 preferably comprises copper or other electrically conductive materials.

Coil assembly 100 further includes a first heating element 110 and a second heating element 112. Heating elements 110, 112 preferably include resistive heaters. As depicted in FIGS. 2A, heaters 110, 112 each comprise a stainless steel resistive heater having a diameter that is about 0.125 inches. Heaters 110, 112 have two turns similar to coil 102, with the first turn of each heater 110, 112 contained in upper frame portion 106 and the second turn contained in lower frame portion 108. A copper terminal 114 houses the heater adapters. Coil 102 is operably attached to frame 104 in a variety of manners. Preferably the attachment is made using a silver braze, silver solder, soft solder, and the like. Coil 102 is operably attached to frame 104 at a plurality of spaced apart tabs (not shown in FIG. 2). During operation of coil assembly 100, heaters 110, 112 operate to heat frame 104 while fluid, preferably water, flowed through coil 102 operates to cool frame 104. In this manner, dome 10 can be maintained at a desired, and preferably constant, temperature throughout the periphery of frame 104.

Figure 3:
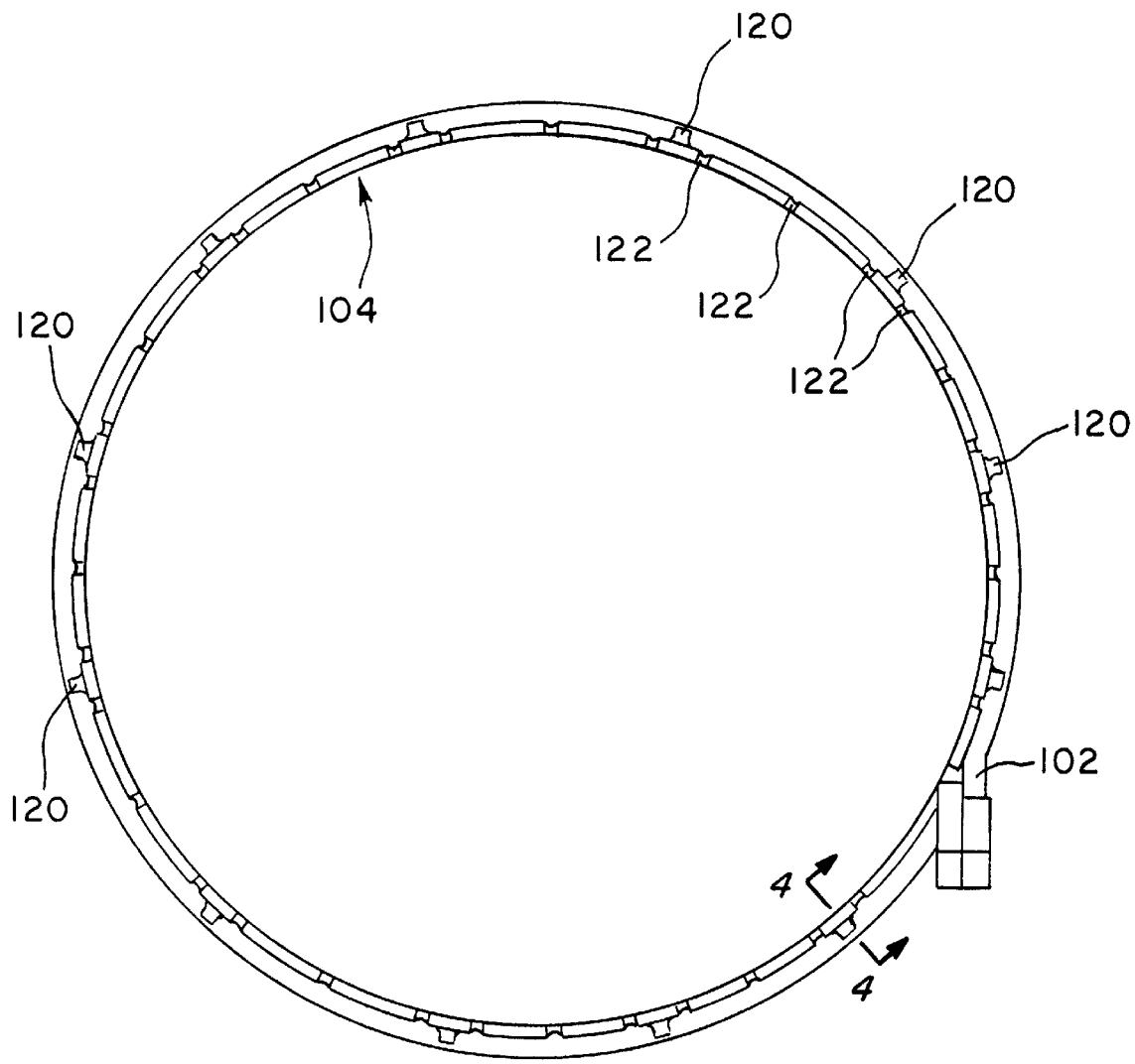
FIG. 3 depicts a top view of the antenna coil assembly depicted in FIG. 2.

Turning now to FIG. 3, coil assembly 100 will be described in further detail using the top view depicted therein. As previously described, coil 102 is operably attached to frame 104 at a plurality of spaced apart tabs 120. Tabs 120 may be coupled to frame 104, or integrally formed with frame 104. In one embodiment, tabs 120 comprise the same material as frame 104. Frame 104 is subjected to thermal cycling as a result of the heating and cooling to frame 104 during operation of system 2. The thermal cycling of frame 104 causes expansion and contraction thereof. Prior to the present invention, this movement of frame 104 tended to crack frame 104, which typically led to cracking of antenna coil 102. The resultant fluid leaks from antenna coil 102 tended to cause electrical shorting of heating element 110 and, as a result, shut down of system 2. As depicted in FIG. 3, frame 104 is provided with a plurality of spaced apart scallops or notches 122 that provide stress relief. As a result of notches 122, the stresses caused by thermal cycling of frame 104 are focused at the notched locations 122. Notches 122 operate to permit the expansion and contraction of frame 104 without providing undue stress to tabs 120, which are the locations at which coil 102 is connected to frame 104. As a result, the lifetime of frame 104, and hence the lifetime of assembly 100, is extended. Notches 122 allow flexing of frame 104 at notches 122. The stress within frame 104 is dissipated at notches 122 by movement/deflection rather than stressing an otherwise rigid structure.

In the embodiment depicted in FIG. 3, each tab 120 has one notch 122 on either side of tab 120, with another notch 122 spaced generally in the middle of the gap between adjacent tabs 120. It will be appreciated by those skilled in the art that other arrangements of notches 122 may be used within the scope of the present invention. Further, varying notch geometries and/or grooves also may be used.

Figure 4A:
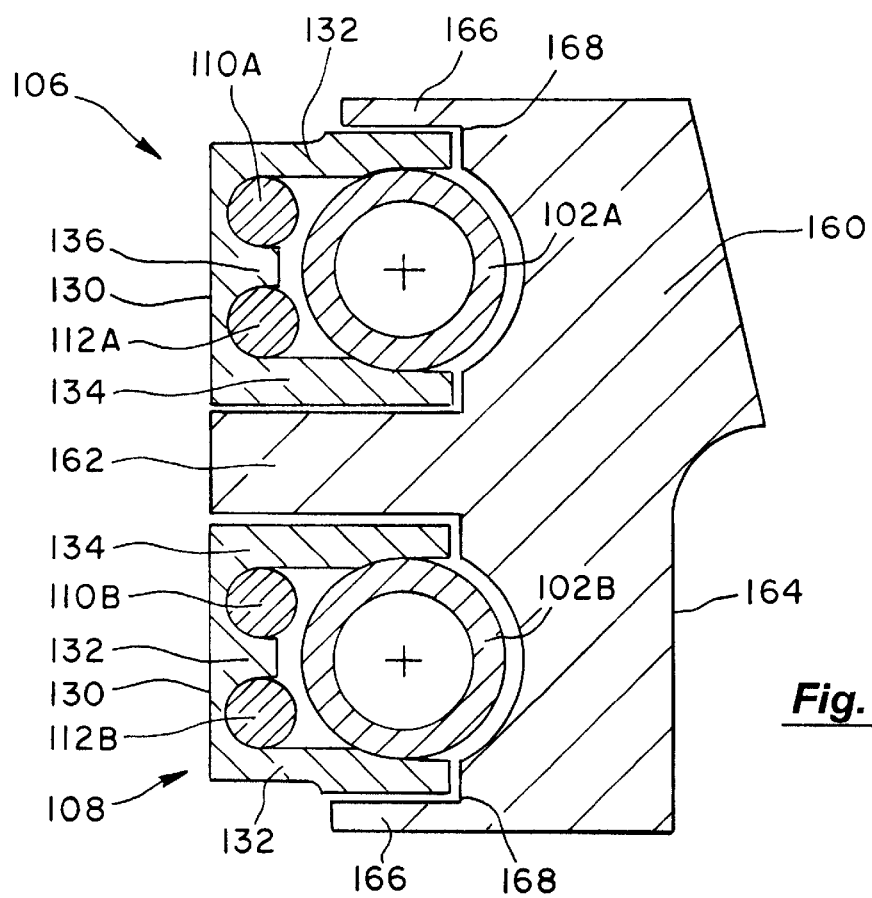
FIGS. 4A–4B depict cross-sectional side views of two alternative antenna coil assemblies according to the present invention.
Figure 4B:
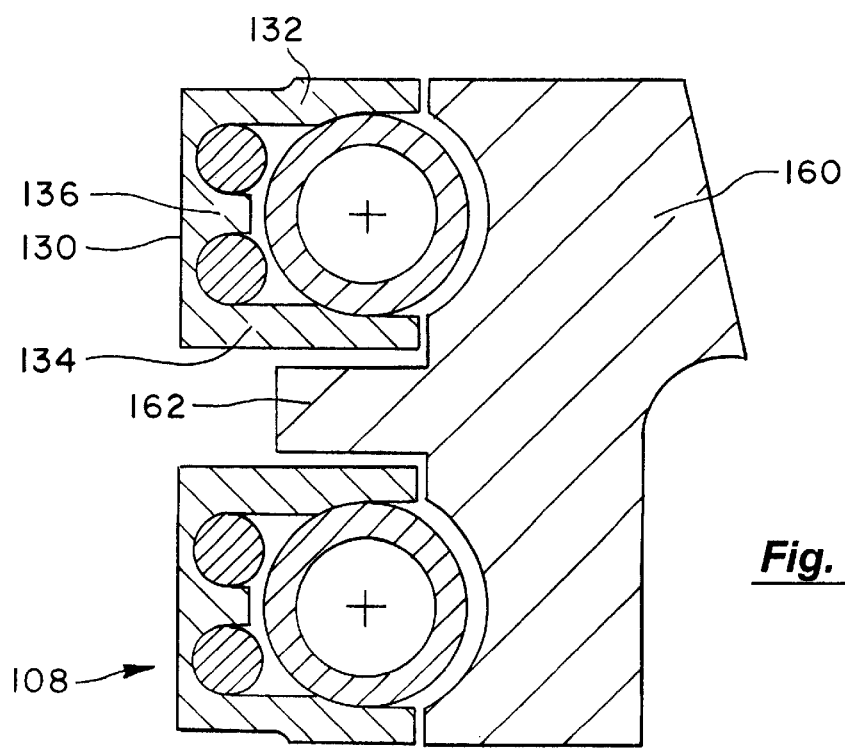

FIGS. 4A–4B depict alternative side cross-sectional views of antenna coil assembly 100 depicted in FIGS. 2 and 3. Coil assembly 100 includes an upper frame portion 106 and a lower frame portion 108. Antenna coil 102 has a first or upper turn 102A disposed within upper frame portion 106, and a second or lower turn 102B disposed in lower frame portion 108. It will be appreciated by those skilled in the art that the selection of the terms upper and lower are merely arbitrary and, as a result, the reverse or other order of positioning may be used. Further, it will be appreciated by those skilled in the art that turns 102A, 102B can be two separate coils.

Upper frame portion 106, and lower frame portion 108 each have a base portion 130, an outer extension 132, an inner extension 134, and a center extension 136 placed between the outer and inner extensions 132, 134. Upper and lower antenna coil turns 102A, 102B are positioned between outer and inner extensions 132, 134. As depicted in FIGS. 4A–4B, extensions 132, 134 and 136 operate to form two channels into which heating elements 110, 112 are disposed. Heating element 110 has an upper turn 110A disposed within upper frame portion 106 and a lower turn 110B disposed in lower frame portion 108. As depicted in FIGS. 4A and 4B, upper turn 110A of heating element 110 is disposed between outer extension 132 and center extension 136 of upper frame portion 106, and lower turn 110B of heating element 110 is disposed between inner extension 134 and center extension 136 of lower frame portion 108.

The embodiment depicted in FIG. 4A and 4B further includes a second heating element 112. Similar to first heating element 110, second heating element 112 is shown having two turns 112A, 112B. Upper turn 112A of second heating element 112 is disposed between the center extension 136 and inner extension 134 of upper frame portion 106. Lower turn 112B of second heating element 112 is disposed between the center extension 136 and outer extension 132 of lower frame portion 108. It will be appreciated by those skilled in the art that more than two heating elements may be used within the scope of the present invention. Similarly, a single heating element may be used within the scope of the present invention. Further, the heating element(s) can have more or fewer turns than depicted in FIGS. 4A–4B.

FIGS. 4A–4B further include a clamp 160 coupled to upper and lower frame portions 106, 108. Clamps 160 preferably comprise an insulative material. Clamp 160 includes a spacer 162 which operates to provide separation between upper and lower frame portions 106, 108, and hence between upper and lower coil turns 102A, 102B. In this manner, a voltage differential can be established and maintained between the upper and lower coil turns 102A, 102B. As depicted in FIG. 4A, spacer 162 may extend the full length of inner extensions 134 so that the bottom of spacer 162 is aligned with the base portion 130 of the lower and upper frame portions 106, 108. Alternatively, as shown in FIG. 4B, spacer 162 extends part of the way along the length of inner extensions 134.

In the embodiment depicted in FIG. 4A, clamp 160 further includes two arms 166 which extend along the portion of the outer extension 132 of the upper and lower frame portions 106, 108. In this particular embodiment, arms 166 have a notch 168 so that clamp 160 can be disposed around the end of outer extensions 132. As shown in FIG. 4B, this particular embodiment has a clamp 160 abutting the ends of the outer extensions 132. Preferably, clamp 160 is designed to permit the expansion of coil 102 without contacting clamp 160. Clamp 160 is held in place by one or more springs (not shown), such as coil springs, which provide compressive force against an outer edge 164 of clamp 160. In this manner, clamp 160 is held against frame 104.

Clamps 160 further preferably have comparatively low thermal expansion compared to frame 104. In one particular embodiment, clamp 160 is made from a Vespel™ material manufactured by E. I. DuPont De Nemours & Co. In other embodiments, clamp 160 comprises a polymide, a ceramic, or the like. Base portion 130 of upper and lower frames 106, 108 (and spacer 162 for the embodiment shown in FIG. 4A) are disposed against faraday shield 74 as shown in FIG. 1. In this manner, antenna coil assembly 100 is positioned adjacent to interior 16 of dome 10.

In one embodiment, clamps 160 are spaced about the periphery of frame 104 and are positioned at about every other tab 120. In this manner, clamps 160 locally maintain frame 104 against dome 10 at the tabbed locations. This arrangement permits the expansion and contraction of frame 104 between the clamped locations during thermal cycling. Alternatively, different numbers and arrangements of clamps 160 may be used, including having one clamp 160 for each tab 120. Notches 122 in frame 104 between tabs 120 permit the flexing of frame 104 during this thermal cycling while reducing the stresses otherwise placed on the tab-coil connections and/or the clamped tabs. Hence, the positioning of notches 122 around the periphery of frame 104 provide at least some reduction in the stresses otherwise realized by frame 104 at these locations, and further reduces the stresses to coil 102. Notches 122 permit movement of frame 104 at controlled locations to mitigate stress intensity guild-up within frame 104. Notches 122 are designed and positioned to permit frame 104 movement/deflection within the elastic range of the frame 104 materials without fatigue stress failure.

The invention has now been described in detail. However, it will be appreciated that certain changes and modifications may be made. Therefore, the scope and contents of this invention are not limited by the foregoing description. Rather, the scope and contents are to be defined by the following claims.

What is claimed is:

1. A chamber for processing a substrate, comprising:
   a chamber body comprising a top and sidewalls defining an interior; and
   an antenna coil assembly disposed adjacent said sidewalls, said antenna coil assembly comprising,
      an antenna coil disposed in a frame, said frame comprising;
         a plurality of spaced apart tabs around a periphery of said frame, said tabs adapted to engage a plurality of clamps to clamp said frame in generally fixed positions at said tabs; and
         at least one notch between each pair of adjacent tabs, said notches adapted to facilitate thermal expansion and contraction of said frame between said tabs.

2. A chamber as in claim 1, further comprising said plurality of clamps coupled to at least a portion of said plurality of tabs, said clamps operating to locally maintain said antenna coil assembly adjacent said sidewalls.

3. A chamber as in claim 2, wherein said notches are positioned around said periphery of said frame to reduce stresses on said frame at said tabs due to thermal expansion and contraction of said frame.

4. A chamber as in claim 2, wherein said plurality of clamps each comprises an electrically nonconductive material and each comprises a spacer, said plurality of spacers adapted to maintain a gap between said upper frame portion and said lower frame portion.

5. A chamber as in claim 1, further comprising at least one heating element disposed in said frame, said heating element adapted to heat said frame and said antenna coil adapted to cool said frame.

6. An antenna coil assembly for a substrate processing chamber, comprising:
   an antenna coil disposed in a frame, said frame comprising a plurality of spaced apart tabs around a periphery of said frame, said coil coupled to said frame at said tabs; and at least one notch between each pair of adjacent tabs, said notches adapted to facilitate thermal expansion and contraction of said frame between said tabs and reduce stresses on said frame at said tabs when said tabs are clamped in generally fixed positions.

7. An antenna coil assembly as in claim 6 wherein said antenna coil comprises at least two turns of a tubing comprising a thermally conductive material.

8. An antenna coil assembly as in claim 6, wherein said frame comprises two turns of a generally trough-shaped frame defining an upper frame portion and a lower frame portion, and wherein said antenna coil has a first turn disposed in said upper frame portion and a second turn disposed in said lower frame portion.

9. An antenna coil assembly as in claim 8, further comprising a heating element having a first turn disposed in said upper frame portion and a second turn disposed in said lower frame portion.

10. An antenna coil assembly as in claim 8, further comprising first and second heating elements, each of said heating elements comprising a first turn disposed in said upper frame portion and a second turn disposed in said lower frame portion.

11. An antenna coil assembly as in claim 6, wherein said frame has a generally cylindrical shape.

12. An antenna coil assembly as in claim 6, wherein said frame comprises a thermally conductive material.

13. An antenna coil assembly as in claim 12, wherein said frame comprises copper.

14. An antenna coil assembly as in claim 6, further comprising at least one heating element disposed in said frame.

15. An antenna coil assembly as in claim 6, further comprising a plurality of notches in said frame between each pair of adjacent tabs.

16. An antenna coil assembly as in claim 15, wherein each of said purality of notches locally reduces a thickness of said frame.

17. An antenna coil assembly as in claim 6, further comprising a plurality of clamps coupled to at least a portion of said plurality of tabs.

18. An antenna coil assembly as in claim 17, wherein said frame comprises a first turn defining an upper frame portion and a second turn defining a lower frame portion, and each of said plurality of clamps comprises a spacer, said plurality of spacers adapted to maintain a generally uniform distance between said upper frame portion and said lower frame portion.

19. An antenna coil assembly for a substrate processing chamber, comprising:

an antenna coil and at least one heating element disposed in a frame, said frame comprising a first turn defining an upper frame portion and a second turn defining a lower frame portion;

a plurality of spaced apart tabs around a periphery of said upper and lower frame portions, said coil coupled to said upper and lower frame portions at said plurality of tabs; and at least one notch between each pair of adjacent tabs, said notches adapted to facilitate thermal expansion and contraction of said upper and lower frame portions between said tabs.

20. An antenna coil assembly as in claim 19, wherein said antenna coil and said at least one heating element each have a first turn disposed in said upper frame portion and a second turn disposed in said lower frame portion.

21. An antenna coil assembly as in claim 19, wherein said notches are positioned around said periphery of said frame to reduce stresses on said frame at said tabs due to thermal expansion and contraction of said frame.

22. An antenna coil assembly as in claim 19 further comprising a plurality of clamps to clamp said tabs in a generally fixed position.

* * * * *